United States Patent
Nguyen et al.

(10) Patent No.: US 11,557,997 B2
(45) Date of Patent: Jan. 17, 2023

(54) METHOD FOR DETERMINING THE MAGNETIC FLUX OF AN ELECTRIC MACHINE

(71) Applicant: IFP Energies nouvelles, Rueil-Malmaison (FR)

(72) Inventors: Hoai-Nam Nguyen, Rueil-Malmaison (FR); Gianluca Zito, Rueil-Malmaison (FR)

(73) Assignee: IFP ENERGIES NOUVELLES, Rueil Malmaison (FR)

( * ) Notice: Subject to any disclaimer, the term of this patent is extended or adjusted under 35 U.S.C. 154(b) by 44 days.

(21) Appl. No.: 17/278,506

(22) PCT Filed: Sep. 13, 2019

(86) PCT No.: PCT/EP2019/074552
§ 371 (c)(1),
(2) Date: Mar. 22, 2021

(87) PCT Pub. No.: WO2020/058131
PCT Pub. Date: Mar. 26, 2020

(65) Prior Publication Data
US 2022/0038038 A1 Feb. 3, 2022

(30) Foreign Application Priority Data

Sep. 20, 2018 (FR) .................... 18/58.548

(51) Int. Cl.
*H02P 21/14* (2016.01)
*H02P 21/13* (2006.01)
*H03H 21/00* (2006.01)

(52) U.S. Cl.
CPC ............ *H02P 21/141* (2013.01); *H02P 21/13* (2013.01); *H03H 21/0029* (2013.01); *H03H 21/003* (2013.01)

(58) Field of Classification Search
CPC ........ H02P 21/141; H02P 21/13; H02P 23/12; H03H 21/0029; H03H 21/003
See application file for complete search history.

(56) References Cited

U.S. PATENT DOCUMENTS 5,818,192 A * 10/1998 Nozari ................ H02P 21/18
318/705
10,218,301 B1 * 2/2019 Wang .................. H02P 21/18
(Continued)

FOREIGN PATENT DOCUMENTS

EP    1885054 A1    2/2008
EP    2582036 A2    4/2013
(Continued)

OTHER PUBLICATIONS

International Search Report for PCT/EP2019/074552, dated Oct. 18, 2019.
(Continued)

*Primary Examiner* — Said Bouziane
(74) *Attorney, Agent, or Firm* — Fitch, Even, Tabin & Flannery LLP (57) ABSTRACT

The present invention relates to a method of determining the magnetic flux φ of an electric machine, based on measurements (MES) of currents and voltages in the phases of the electric machine, on a dynamic model (MOD) of the magnetic flux and on an adaptive Kalman filter (KAL).

18 Claims, 2 Drawing Sheets

(56) References Cited

U.S. PATENT DOCUMENTS

2016/0254771 A1    9/2016  Qiao et al.
2017/0179863 A1*   6/2017  Lamsahel ............ G01R 31/343
2018/0069499 A1*   3/2018  Engelken ................ H02P 25/22

FOREIGN PATENT DOCUMENTS

FR          2984637  A1      6/2013
FR          3035755  A1     11/2016

OTHER PUBLICATIONS

Koteich Mohamad. "Flux estimation algorithms for electric drives: A comparative study" 2016 3rd International Conference on Renewable Energies for Developing Countries (REDEC), IEEE, Jul. 13, 2016 (Jul. 13, 2016). pp. 1-6 DOI: 10.I 109/REDEC.2016.7577558 XP032972837.

* cited by examiner

METHOD FOR DETERMINING THE MAGNETIC FLUX OF AN ELECTRIC MACHINE

CROSS-REFERENCE TO RELATED APPLICATIONS

This application is a U.S. national phase application filed under 35 U.S.C. § 371 of International Application No. PCT/EP2019/074552, filed Sep. 13, 2019, designating the United States, which claims priority from French Patent Application No. 18/58.548, filed Sep. 20, 2018, which are hereby incorporated herein by reference in their entirety.

BACKGROUND OF THE INVENTION

Field of the Invention

The present invention relates to the field of control of electrical machines, in particular control of salient-pole synchronous electrical machines. These electrical machines find applications notably in the field of motor vehicles.

Description of the Prior Art

Conventionally, an electrical machine comprises a rotor (mobile part) and a stator (stationary part). The rotor is usually housed in the stator. Generally, the stator has an annular shape and it is housed within a tubular support to which it is fastened.

The stator comprises magnetic flux generators, generally electrical windings. These windings are fed by (conventionally three) of electrical phases in order to generate a rotating magnetic field. Furthermore, depending on the type of electrical machine, notably for salient-pole synchronous electrical machines, the rotor can comprise permanent magnets.

During operation of such an electrical machine, an electrical current flows through the windings to generate the magnetic field required to rotate the rotor.

There are several types of control for such electrical machines. It is notably well known that the direct torque control method is one of the most effective control strategies, enabling torque control in a steady regime as well as a transient regime, in particular for salient-pole synchronous electrical machines. Furthermore, this control method is easier to implement than a field-oriented control method. Moreover, this method requires less information relative to the electrical machine, and no current control loop is necessary, which notably allows solution of the delay problem linked with this current control loop.

However, the drawback of this control method is that it is based on the magnetic flux signal of the electrical machine, whereas this quantity cannot be directly measured while the electrical machine is operating. The magnetic flux then needs to be estimated, for example by an observer using the other measurable quantities. The document: Mohamad Koteich. "Flux Estimation Algorithms for Electrical Drives: a Comparative Study", in: Renewable Energies for Developing Countries (REDEC), 2016, 3rd International Conference, IEEE, 2016, pp. 1-6 (cit. on p. 5) reviews a number of methods of determining the magnetic flux.

Most methods of the prior art require knowledge of the resistance, the magnetic flux of the rotor and the inductance. However, while the resistance can be considered as known, the exact value of the magnetic flux of the rotor remains unknown, notably because it depends on the temperature of the rotor, which cannot be directly measured. Moreover, in the presence of magnetic saturation, the inductance is a non-linear function of the current. Therefore, the problem of estimating the magnetic flux of the electrical machine is non-trivial, which involves at least one of complexity and imprecision in making estimations.

Patent application FR-3,035,755 describes a method of controlling an electrical machine based on an estimation of the magnetic flux obtained by an observer and a discrete extended Kalman algorithm. The modelling process used in this method is not very robust against parameter variations, notably because the magnetic flux is indirectly estimated since it requires calculating the currents. Furthermore, the model described in this patent application does not take account for the non-linearity of the inductances (magnetic saturation). Moreover, the discrete extended Kalman algorithm does not allow variability over time of the system. Indeed, the extended Kalman filter only accounts for the non-linearity linked with the presence of speed in the equations.

In order to overcome these drawbacks, the present invention relates to a method of determining the magnetic flux of an electrical machine, based on measurements of currents and voltages in the phases of the electrical machine, on a dynamic model of the magnetic flux and on an adaptive Kalman filter. The dynamic model of the magnetic flux provides a precise (taking account of the variability over time of the system) and robust model of the magnetic flux. Thus, the magnetic flux is directly determined. The adaptive Kalman filter allows adaptation of the noise covariance matrix according to the rotational speed of the electrical machine. Thus, the filter is efficient over a wide operating range of the electrical machine. Moreover, the adaptive Kalman filter is robust against magnetic flux variations of the rotor and the inductance.

The invention also relates to a method and to a system for controlling an electrical machine using the method of determining the magnetic flux.

SUMMARY OF THE INVENTION

The invention relates to a method of determining the magnetic flux of an electrical machine, the electrical machine comprising a rotor, a stator, the stator comprising windings connected to electrical phases. The following steps are carried out for this method:

a) measuring a current and a voltage in the phases of the electrical machine;

b) determining the electrical rotational speed of the rotor, notably as a function of the mechanical rotational speed of the rotor;

c) constructing a dynamic model of the magnetic flux of the electrical machine, the dynamic model of the magnetic flux connecting the magnetic flux to the current and to the voltage of the phases of the electrical machine, and to the electrical rotational speed of the rotor; and d) determining the magnetic flux $\varphi$ by applying an adaptive Kalman filter to the dynamic magnetic flux model, the dynamic magnetic flux model being applied to the current and voltage measurements and to the determined electrical rotational speed.

According to an embodiment, the electrical rotational speed $\omega e$ of the rotor is determined with a formula of a type $\omega e = p\omega$, with p being the pole pair number of the electrical machine and $\omega$ being the mechanical rotational speed of the rotor.

Advantageously, the mechanical rotational speed is determined by a phase-locked loop PLL method.

According to an implementation, the dynamic magnetic flux model (MOD) is written:

$$\varphi_d(t) = L_d i_d(t) + \sqrt{\frac{3}{2}}\,\Phi,$$

$$\varphi_q(t) = \begin{cases} L_{qs} i_q(t) - b_{qs}, & \text{if } i_q(t) \leq -i_{qm}, \\ L_q i_q(t), & \text{if } -i_{qm} \leq i_q(t) \leq i_{qm}, \\ L_{qs} i_q(t) + b_{qs} & \text{if } i_{qm} \leq i_q(t) \end{cases}$$

with $\varphi$ being the magnetic flux of the electrical machine, i being the current, $\Phi$ the rotor flux, L being the inductances of the electrical machine, $L_{qs}$, $b_{qs}$ being coefficients accounting for the saturation effect, d and q being the axes in Park's reference frame, and $i_{qm}$ being the quadrature current value for which the magnetic flux is a linear function of the quadrature current.

According to an aspect, the adaptive Kalman filter is applied by carrying out the following steps:

i) modifying the dynamic magnetic flux model by integrating uncertainties in the model and a measurement noise;

ii) discretizing the modified dynamic magnetic flux model; and iii) applying an adaptive Kalman filter algorithm to the modified and discretized model.

According to a feature, the adaptive Kalman filter algorithm is applied by carrying out the following steps:

(1) initializing k=0, the state vector $\hat{x}(0)$ and the state of the covariance matrix $P(0|0)=P_0$, (2) applying the time update and measurement update equations in order to obtain $\hat{x}(k|k)$ and $P(k|k)$:

$$\begin{cases} \hat{x}(k\mid k-1) = A_d \hat{x}(k-1\mid k-1) + B_d \upsilon(k-1) \\ P(k\mid k-1) = A_d P(k-1\mid k-1) A_d^T + B_d Q_e B_d^T \end{cases}$$

$$\begin{cases} K(k) = P(k\mid k-1)(P(k\mid k-1) + R)^{-1} \\ \hat{x}(k\mid k) = \hat{x}(k\mid k-1) + K(k)(x(k) - \hat{x}(k\mid k-1)), \\ P(k\mid k) = (I - K(k)) P(k-1) \end{cases}$$

(3) determining the magnetic flux $\varphi$ estimated at time k by using the formulas:

$$\begin{cases} \hat{\varphi}_d(k) = \hat{x}_1(k\mid k) \\ \hat{\varphi}_q(k) = \hat{x}_2(k\mid k) \end{cases}$$

with k being the discretized time, A_d, B_d state realization matrices, P being the covariance matrix of the state vector, R being a calibration matrix, K being the Kalman filter gain and Q_e being an adjustment parameter.

Advantageously, the electrical machine is a salient-pole synchronous electrical machine.

Furthermore, the invention relates to a method for controlling an electrical machine comprising the following steps:

a) determining a magnetic flux $\varphi$ of the electrical machine by use of the method of determining the magnetic flux according to one of the above features; and b) controlling (CON) the electrical machine by using the determined magnetic flux.

Advantageously, the electrical machine is controlled (CON) according to a method providing direct control of the torque of the electrical machine implemented from the magnetic flux.

Moreover, the invention relates to a system for controlling an electrical machine, comprising control implementing the control method according to one of the above features.

BRIEF DESCRIPTION OF THE DRAWINGS

Other features and advantages of the method according to the invention will be clear from reading the description hereafter of embodiments given by way of non-limitative example, with reference to the accompanying figures wherein.

DETAILED DESCRIPTION OF THE INVENTION

The present invention relates to a method for determining, in real time, the magnetic flux of an electrical machine. The electrical machine comprising a rotor and a stator, the stator being equipped with windings connected to the electrical phases, for example three electrical phases for generating a magnetic field enabling rotation of the rotor.

Figure 1:
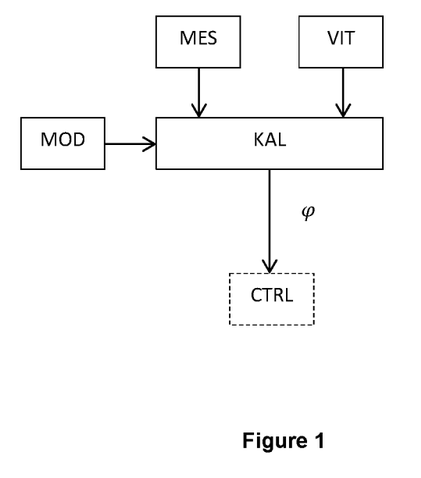
FIG. 1 illustrates the steps of the method according to an embodiment of the invention.

FIG. 1 schematically describes, by way of non-limitative example, the steps of the method according to an embodiment of the invention. The method of determining the magnetic flux comprises the following steps:

1) Measurement of currents and voltages (MES)
2) Determination of the electrical rotational speed (VIT)
3) Construction of the dynamic magnetic flux model (MOD)
4) Application of the adaptive Kalman filter (KAL)

Steps 1) to 3) are independent and they can be carried out in this order, in a different order or simultaneously.

Step 4) determines magnetic flux $\varphi$ of the electrical machine.

Furthermore, the invention relates to a method of controlling an electrical machine. Such a control method comprises steps 1) to 4) described above and an electrical machine control step (CTRL) 5).

This control step 5) is an optional step. Indeed, the magnetic flux can be used in a different manner, notably for electrical machine fault diagnosis.

Steps 1 to 5) are described in detail in the rest of the description hereafter.

Notations:

The following notations are used in the description:

v: voltages at the phase terminals of the electrical machine, i: currents circulating in the phases of the electrical machine, $i_{qm}$: quadrature current value for which the magnetic flux is a linear function of the quadrature current, $\omega$: mechanical rotational speed of the rotor, corresponding to the rotational speed of the rotor of the electrical machine in relation to the stator, $\omega_e$: electrical rotational speed of the rotor, $\Phi$: magnetic flux intensity of the rotor magnet, considered for the method according to the invention, in a nominal case, for a temperature of 20° C., R(t): resistance of the electrical machine windings, it is a known parameter that can be obtained experimentally, $L_d$: direct inductance of the electrical machine, it is a known parameter of the electrical machine (manufacturer data or experimentally obtained data), $L_q$: quadrature inductance of the electrical machine which is a known parameter of the electrical machine (manufacturer data or experimentally obtained data), $L_{qs}$: inductance accounting for the saturation phenomenon (manufacturer data or experimentally obtained data), p: pole pair number of the electrical machine, φ: magnetic flux of the electrical machine, A: matrix of the state representation $$A = \begin{pmatrix} 0 & \omega_e(t) \\ -\omega_e(t) & 0 \end{pmatrix},$$

B: identity matrix $$B = \begin{pmatrix} 1 & 0 \\ 0 & 1 \end{pmatrix},$$

f: function of the state representation, $b_{qs}$: scalar coefficient taking account of the saturation phenomenon, this value can be obtained experimentally, u: vector of the state representation data, $$x = \begin{pmatrix} \varphi_d \\ \varphi_q \end{pmatrix}$$

state vector of the state representation, corresponding to the non-measurable state, ϵ: unmodelled dynamics, η: measurement noise, Ts: sampling period, k: discretized time, $A_d$: matrix of the discretized state representation, $B_d$: matrix of the discretized state representation, J: cost function minimized by the Kalman filter, P: covariance matrix of the state vector, $P_0$, Q, R: calibration matrices, $Q_\epsilon$: adjustment parameter, K: Kalman filter gain.

The estimated values are denoted by a hat (circumflex accent). The mean values are indicated by an overline above the variable. The time derivatives are indicated by a dot. The notations bearing subscripts $_d$ (direct) or $_q$ (quadrature) mean that the quantities are expressed in Park's reference frame. Besides, the initial state values are given with a 0 (t or k=0).

1) Measurement of Currents and Voltages

The currents and the voltages in the phases of the electrical machine are measured in this step.

These measurements can be performed by voltage and current sensors.

2) Determination of the Electrical Rotational Speed of the Rotor

This step determines the electrical rotational speed of the rotor.

According to an embodiment of the invention, the electrical rotational speed of the rotor can be determined from the mechanical rotational speed of the rotor, by use of the formula: ωe=pω.

According to an implementation of this embodiment, the mechanical rotational speed of the rotor can be estimated using any method known to the person skilled in the art. For example, the mechanical rotational speed can be estimated from a phase-locked loop (PLL) type method. In a variant, the method of estimating the mechanical rotational speed can be as described in patent application FR-2,984,637.

Alternatively, the mechanical rotational speed of the rotor can be measured by a speed sensor arranged on the electrical machine.

In a variant, the electrical rotational speed can be directly determined.

3) Construction of the Dynamic Magnetic Flux Model

A dynamic model of the magnetic flux is constructed in this step. The dynamic magnetic flux model connects the magnetic flux to the current, to the voltage in the electrical phases of the electrical machine and to the electrical rotational speed of the rotor. The model is referred to as dynamic because it is a function of the rotational speed.

The dynamic magnetic flux model is a state representation of the electrical machine. It is noted that, in systems theory (and automation), a state representation allows a dynamic system to be modelled in matrix form, using state variables. This representation may be linear or not, continuous or discrete. The representation allows determination of the internal state and the outputs of the system at any future time if the state at the initial time and the behavior of the input variables that influence the system are known.

In Park's reference frame (d, q), the dynamic magnetic flux model can be expressed by the following differential equations:

$$\begin{cases} \dot{\varphi}_d(t) = -R(t)i_d(t) + \omega_e(t)\varphi_q(t) + v_d(t) \\ \dot{\varphi}_q(t) = -R(t)i_q(t) - \omega_e(t)\varphi_d(t) + v_q(t) \end{cases},$$

Writing these differential equations in vector form:

$$\begin{bmatrix} \dot{\varphi}_d(t) \\ \dot{\varphi}_q(t) \end{bmatrix} = \begin{bmatrix} 0 & \omega_e(t) \\ -\omega_e(t) & 0 \end{bmatrix} \begin{bmatrix} \varphi_d(t) \\ \varphi_q(t) \end{bmatrix} + \begin{bmatrix} v_d(t) - R(t)i_d(t) \\ v_q(t) - R(t)i_q(t) \end{bmatrix}$$

or, in an equivalent manner:

$$\dot{x}(t) = A(t)x(t) + Bu(t)$$

with $$x(t) = \begin{bmatrix} \varphi_d(t) \\ \varphi_q(t) \end{bmatrix}$$

being the non-measurable state and $$u(t) = \begin{bmatrix} v_d(t) - R(t)i_d(t) \\ v_q(t) - R(t)i_q(t) \end{bmatrix}$$

being the model input.

According to this equation, it is clear that the equation of state of the magnetic flux of the electrical machine can be described by a linear model over time. However, the equation of state of the magnetic flux is a highly non-linear function of currents $i_d$ and $i_q$, and of magnetic flux Φ of the rotor. It is written:

$$\begin{cases} \varphi_d(t) = f_d(i_q(t), i_q(t)) + \sqrt{\dfrac{3}{2}}\,\Phi(t) \\ \varphi_q(t) = f_q(i_q(t), i_q(t)) \end{cases}$$

Figure 2:
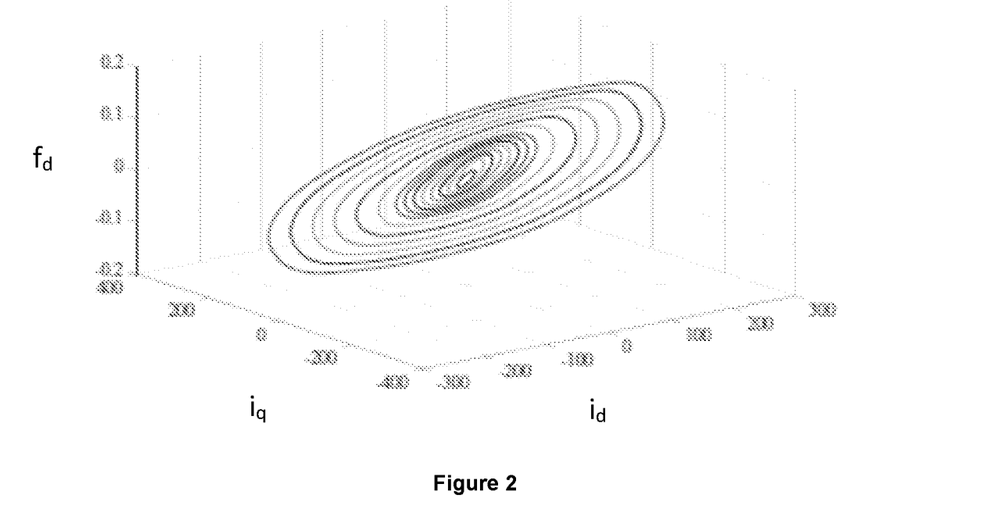
FIGS. 2 and 3 show the values, in Park's reference frame, of the magnetic flux of the electrical machine as a function of the current.
Figure 3:
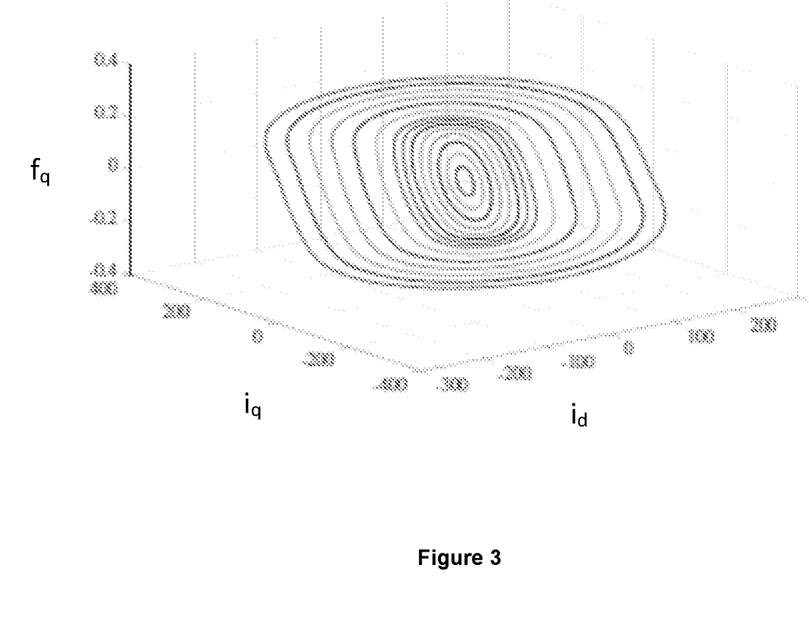

FIGS. 2 and 3 show examples of functions $f_d$ and $f_q$ as a function of currents $i_d$ and $i_q$ for a given application. It is noted that, while function $f_d$ is a relatively linear function in relation to $i_d$, this is not the case for function $f_q$. Thus, the problem of estimating the magnetic flux of the electrical machine becomes more complex, all the more so since functions $f_d$ and $f_q$ are also a function of the mechanical angle of the rotor.

A solution to this complex problem could map the magnetic flux quantities $\varphi_d$ and $\varphi_q$. This solution requires a high storage capacity and a large number of experimental measurements. Moreover, the magnetic flux of the rotor varies with temperature. The model described above is therefore complex to implement.

According to an embodiment of the invention, it is possible to construct a dynamic magnetic flux model simple to implement while remaining accurate, and the simplified model can be defined by the following equations:

$$\begin{cases} \varphi_d(t) = L_d i_d(t) + \sqrt{\dfrac{3}{2}}\,\Phi, \\ \varphi_q(t) = \begin{cases} L_{qs} i_q(t) - b_{qs}, & \text{if } i_q(t) \le -i_{qm}, \\ L_q i_q(t), & \text{if } -i_{qm} \le i_q(t) \le i_{qm}, \\ L_{qs} i_q(t) + b_{qs} & \text{if } i_{qm} \le i_q(t) \end{cases} \end{cases}$$

This model has the advantage of being accurate without being memory and computational time consuming, which facilitates its implementation in an adaptive Kalman filter and possibly in an electrical machine control method.

According to an implementation of this embodiment, magnetic flux $\Phi$ of the rotor can be considered in a nominal case where a temperature of 20° C. is considered.

For this embodiment, the equation of state is written:

$$\dot{x}(t) = A(t)x(t) + Bu(t)$$

$$x(t) = \begin{bmatrix} L_d i_d(t) + \sqrt{\dfrac{3}{2}}\,\Phi \\ f(i_d(t)) \end{bmatrix}$$

with:

$$f(i_d(t)) = \begin{cases} L_{qs} i_q(t) - b_{qs}, & \text{if } i_q(t) \le -i_{qm}, \\ L_q i_q(t), & \text{if } -i_{qm} \le i_q(t) \le i_{qm}, \\ L_{qs} i_q(t) + b_{qs} & \text{if } i_{qm} \le i_q(t) \end{cases}$$

4) Application of the Adaptive Kalman Filter

The magnetic flux of the electrical machine is determined in this step. An adaptive Kalman filter is therefore applied to the dynamic model constructed in step 3), to the voltage and current measurements obtained in step 1) and to the electrical rotational speed of the rotor obtained in step 2). Application of the Kalman filter allows a state observer to be obtained. The adaptive Kalman filter provides adaptation of the noise covariance matrix as a function of the rotational speed of the electrical machine. Thus, the filter is efficient over a wide operating range of the electrical machine. Moreover, the adaptive Kalman filter is robust against magnetic flux variations of the rotor and the inductance.

It is noted that a state observer, or a state estimator, is, in systems theory and automation, an extension of a model represented as a state representation. When the state of the system is not measurable, an observer allowing the state to be reconstructed from a model is constructed.

According to an embodiment of the invention, the adaptive Kalman filter can be applied by carrying out the following steps:

modifying the dynamic magnetic flux model by integrating unmodelled dynamics and a measurement noise;

discretizing the modified dynamic magnetic flux model; and applying an adaptive Kalman filter algorithm to the modified and discretized dynamic model.

According to an example of this embodiment, the various steps described hereafter can be carried out.

The dynamic model of the magnetic flux is modified accounting for the uncertainties of the model $E(t)$ and the measurement noise $\eta(t)$. The modified model can be written:

$$\begin{cases} \dot{x}(t) = A(t)x(t) + Bu(t) + \epsilon(t) \\ x(t) = \begin{bmatrix} L_d i_d(t) + \sqrt{\dfrac{3}{2}}\,\Phi \\ f(i_d(t)) \end{bmatrix} + \eta(t) \end{cases}$$

It is thus possible to obtain a more realistic magnetic flux model.

This model is then discretized for application of the Kalman filter. A sampling period $T_S$ is therefore considered. The following equations can then be written:

$$\begin{cases} x(k) = A_d(k-1)x(k-1) + B_d(k-1)u(k-1) + B_d(k-1)\epsilon(k-1) \\ x(t) = \begin{bmatrix} L_d i_d(k) + \sqrt{\dfrac{3}{2}}\,\Phi \\ f(i_d(k)) \end{bmatrix} + \eta(k) \end{cases}$$

with:

$$\begin{cases} A_d(k-1) = e^{T_e A(t)}, \\ B_d(k-1) = \int_0^{T_s} e^{\tau A(\tau)} B\, d\tau \end{cases}$$

Given that matrix A is a function of speed, itself a function of time, it is not possible to determine matrices $A_d$ and $B_d$ analytically.

According to an aspect of this embodiment, matrices $A_d$ and $B_d$ can be obtained by a Taylor series. Preferably, for efficiency purposes, matrices $A_d$ and $B_d$ can be determined by a 3rd order Taylor series. In this case, matrices $A_d$ and $B_d$ can be written:

$$A_d = \begin{bmatrix} 1 & 0 \\ 0 & 1 \end{bmatrix} + T_s \begin{bmatrix} 0 & \omega_e \\ -\omega_e & 0 \end{bmatrix} + \frac{T_s^2}{2}\begin{bmatrix} 0 & \omega_e \\ -\omega_e & 0 \end{bmatrix}^2 + \frac{T_s^3}{6}\begin{bmatrix} 0 & \omega_e \\ -\omega_e & 0 \end{bmatrix}^3,$$

$$B_d = T_s \begin{bmatrix} 1 & 0 \\ 0 & 1 \end{bmatrix} + \frac{T_s^2}{2}\begin{bmatrix} 0 & \omega_e \\ -\omega_e & 0 \end{bmatrix} + \frac{T_s^3}{6}\begin{bmatrix} 0 & \omega_e \\ -\omega_e & 0 \end{bmatrix}^2 + \frac{T_s^4}{24}\begin{bmatrix} 0 & \omega_e \\ -\omega_e & 0 \end{bmatrix}^3$$

Finally, an adaptive Kalman filter algorithm is applied. Then:

$$\zeta(k) = B_d \epsilon(k).$$

One way of determining the unknown state vector x is accounting for the information $\zeta(k)$ and $\eta(k)$ in the adaptive Kalman filter. In practice, this adaptive Kalman filter provides a solution to the minimization problem described below:

$$\min_{x(k)} J(k)$$

with:

$$J(k) = (x(0) - \bar{x}(0))^T P_0^{-1} (x(0) - \bar{x}(0)) + \sum_{j=1}^{k} (\zeta(j-1)^T Q^{-1} \zeta(k-1) + \eta(j)^T R^{-1} \eta(j))$$

$$\zeta(k-1) = x(k) - A_d(k-1)x(k-1) - B_d u(k-1)$$

$$\eta(k) = x(k) - \begin{bmatrix} L_d i_d(k) + \sqrt{\frac{3}{2}} \Phi \\ f(i_d(k)) \end{bmatrix}$$

Cost function J provides a guide for selecting matrices P0, R and Q, with the following conditions:
1. If the initial state $x(k)$ at the time $k=0$ is known, that is $\bar{x}(0) \approx x(0)$, then the values of matrix $P_0$ are relatively small. Otherwise, the values of matrix $P_0$ are relatively great.
2. If there is much measurement noise, then the values of matrix R are relatively small. Otherwise, the values of matrix R are relatively great.

Furthermore, Q can be selected as:

$$Q = B_d Q_\epsilon B_d^T$$

with $Q_\epsilon$ an adjustment parameter. This relation implies that matrix Q is a function of the rotational speed of the rotor.

In order to solve the minimization problem by use of the adaptive Kalman filter, the below hypotheses can be adopted. These hypotheses mainly concern a mathematical interpretation of matrices $P_0$, R and Q.

initial state x(0) is a random vector that is not correlated with noises $\zeta(k)$ and $\eta(k)$, initial state x(0) has a known mean $\bar{x}(0)$ and a covariance defined by:

$$P_0 = E[(x(0) - \bar{x}(0))(x(0) - \bar{x}(0))^T]$$

where E denotes the expected value, $\zeta(k)$ and $\eta(k)$ are not correlated, and they are white noises with zero mean, with covariance matrices Q and R respectively, in other words:

$$E[\zeta(k)\zeta(j)^T] = \begin{cases} Q, & \text{if } k = j, \\ 0, & \text{if } k \neq j \end{cases}$$

$$E[\eta(k)\eta(j)^T] = \begin{cases} R, & \text{if } k = j, \\ 0, & \text{if } k \neq j \end{cases}$$

$$E[\zeta(k)\eta(j)^T] = 0, \quad \text{for all } k, j$$

It can be noted that this hypothesis also implies that Q and R are symmetric positive semidefinite matrices.

The following notations are also adopted:

$\hat{x}(k|k-1)$ is the estimate of x(k) from the measurements up to the time k−1, i.e. x(k−1), x(k−2), . . . and u(k−1), u(k−2), . . .

$\hat{x}(k|k)$ is the estimate of x(k) from the measurements up to the time k, i.e. x(k), x(k−1), . . . and u(k), u(k−1), . . .

$P(k|k-1)$ is the covariance matrix of x(k) given x(k−1), x(k−2), . . . and u(k−1), u(k−2), . . .

$P(k|k)$ is the covariance matrix of x(k) from the measurements up to the time k, i.e. x(k), x(k−1), . . . and u(k), u(k−1), . . .

The adaptive Kalman filter algorithm can then be summarized as follows, with a time update equation:

$$\begin{cases} \hat{x}(k|k-1) = A_d \hat{x}(k-1|k-1) + B_d u(k-1), \\ P(k|k-1) = A_d P(k-1|k-1) A_d^T + B_d Q_\epsilon B_d^T \end{cases}$$

and a measurement update equation:

$$\begin{cases} K(k) = P(k|k-1)(P(k|k-1) + R)^{-1} \\ \hat{x}(k|k) = \hat{x}(k|k-1) + K(k)(x(k) - \hat{x}(k|k-1)) \\ P(k|k) = (I - K(k))P(k|k-1) \end{cases}$$

Thus, the magnetic flux of the electrical machine can be determined.

According to an implementation of the invention, the adaptive Kalman filter approach can be summarized as follows:

1. The input data estimated at the previous time, listed below, and parameters $Q_\epsilon$ and R (covariance matrices) are used, and we determine:

$$x(k) = \begin{bmatrix} L_d i_d(k) + \sqrt{\frac{3}{2}} \Phi \\ f(i_d(k)) \end{bmatrix}$$

$$u(k) = \begin{bmatrix} v_d(t) - R(t)i_d(t) \\ v_q(t) - R(t)i_q(t) \end{bmatrix}$$

$\hat{x}(k-1|k-1)$ $P(k-1|k-1)$

2. The output is determined by carrying out the steps of:
(1) initializing k=0, state vector $\hat{x}(0)$ and the state of the covariance matrix $P(0|0) = P_0$,
(2) applying the time update and measurement update equations for obtaining $\hat{x}(k|k)$ and $P(k|k)$:

$$\begin{cases} \hat{x}(k|k-1) = A_d \hat{x}(k-1|k-1) + B_d u(k-1), \\ P(k|k-1) = A_d P(k-1|k-1) A_d^T + B_d Q_\epsilon B_d^T \end{cases}$$

-continued $$\begin{cases} K(k) = P(k \mid k-1)(P(k \mid k-1) + R)^{-1} \\ \hat{x}(k \mid k) = \hat{x}(k \mid k-1) + K(k)(x(k) - \hat{x}(k \mid k-1)), \\ P(k \mid k) = (I - K(k))P(k \mid k-1) \end{cases}$$

(3) determining magnetic flux φ estimated at the time k with the formulas:

$$\begin{cases} \hat{\varphi}_d(k) = \hat{x}_1(k \mid k), \\ \hat{\varphi}_q(k) = \hat{x}_2(k \mid k) \end{cases}$$

In these equations, subscript 1 denotes the first term of vector x and subscript 2 denotes the second term of vector x.

5) Electrical Machine Control

This step is optional.

The invention also relates to a method for real-time control of a synchronous electrical machine, wherein the following steps are carried out:

determining the magnetic flux of the electrical machine by use of the method (steps 1) to 4)) described above, and controlling the torque of the synchronous machine as a function of the determined magnetic flux. This step can be carried out using any conventional control of electrical machine that accounts for the magnetic flux. For example, control of the electrical machine can be based on an effective direct torque control method, particularly suited to salient-pole synchronous electrical machines.

Furthermore, the invention relates to a system for controlling a synchronous electrical machine suited to applying the method as described above. Such an electrical machine control system can comprise electrical machine control including control for determining the magnetic flux of the electrical machine for controlling the torque of the electrical machine. The determination of the magnetic flux determines the magnetic flux of the electrical machine from the current and voltage measurements, that is the currents and voltages of each of the three phases of the electrical machine. The torque control applies voltages at the terminals of the electrical machine as a function of the magnetic flux to ensure a torque setpoint for the electrical machine. Advantageously, the control system can be a controller comprising a computer.

This control method and system can be used for an electrical machine on board a vehicle, notably an electrical or hybrid motor vehicle. However, the control system described is not limited to this application and it is suitable for all electrical machine applications.

According to an aspect, the electrical machine is a salient-pole synchronous electrical machine. Indeed, the method is particularly well-suited to this type of machine, on the one hand, because the dynamic model of the electrical machine is quite representative of this type of electrical machine, and on the other hand because determination of the magnetic flux enables control of such an electrical machine, notably through direct control of the torque.

It is clear that the invention is not limited to only the embodiments of the recesses described above by way of example and that it encompasses multiple variants.

The invention claimed is:

1. A method of determining magnetic flux of an electrical machine, the electrical machine comprising a rotor and a stator, the stator comprising windings connected to electrical phases, comprising steps of:

a) measuring a current and a voltage in the electrical phases of the electrical machine;

b) determining electrical rotational speed of the rotor as a function of mechanical rotational speed of the rotor;

c) constructing a dynamic model of the magnetic flux of the electrical machine, the dynamic model of the magnetic flux connecting the magnetic flux to the current and to the voltage of the electrical phases of the electrical machine and to the electrical rotational speed of the rotor; and d) determining the magnetic flux φ by applying an adaptive Kalman filter to the dynamic magnetic flux model, the dynamic magnetic flux model being applied to the current and voltage measurements, to the determined electrical rotational speed, and to adapt a noise covariance matrix as function of the rotational speed of the electrical machine.

2. A magnetic flux determination method as recited in claim 1, wherein the electrical rotational speed of the rotor is determined with a formula ωe=pω, with p being a pole pair number of the electrical machine and ω being the mechanical rotational speed of the rotor.

3. A magnetic flux determination method as claimed in claim 2, wherein the mechanical rotational speed is determined by use of a phase-locked loop method.

4. A magnetic flux determination method as claimed in claim 3, wherein the dynamic magnetic flux model is written as:

$$\begin{cases} \varphi_d(t) = L_d i_d(t) + \sqrt{\dfrac{3}{2}}\,\Phi, \\ \varphi_q(t) = \begin{cases} L_{qs} i_q(t) - b_{qs}, & \text{if } i_q(t) \le -i_{qm}, \\ L_q i_q(t), & \text{if } -i_{qm} \le i_q(t) \le i_{qm}, \\ L_{qs} i_q(t) + b_{qs} & \text{if } i_{qm} \le -i_q(t) \end{cases} \end{cases}$$

with φ being the magnetic flux of the electrical machine, i being the current, Φ being the rotor flux, L being the inductances of the electrical machine, $L_{qs}$, and $b_{qs}$ being coefficients accounting for saturation effect, d and q being the axes in Park's reference frame, and $i_{qm}$ being a quadrature current value for which the magnetic flux is a linear function of the quadrature current.

5. A magnetic flux determination method as claimed in claim 4, wherein the adaptive Kalman filter is applied by carrying out steps of:

i) modifying the dynamic magnetic flux model by integrating uncertainties in the model and a measurement noise;

ii) discretizing the modified dynamic magnetic flux model; and iii) applying an adaptive Kalman filter algorithm to the modified and a discretized magnetic flux model.

6. A magnetic flux determination method as claimed in claim 2, wherein the dynamic magnetic flux model is written as:

$$\begin{cases} \varphi_d(t) = L_d i_d(t) + \sqrt{\dfrac{3}{2}}\,\Phi, \\ \varphi_q(t) = \begin{cases} L_{qs} i_q(t) - b_{qs}, & \text{if } i_q(t) \le -i_{qm}, \\ L_q i_q(t), & \text{if } -i_{qm} \le i_q(t) \le i_{qm}, \\ L_{qs} i_q(t) + b_{qs} & \text{if } i_{qm} \le -i_q(t) \end{cases} \end{cases}$$

with φ being the magnetic flux of the electrical machine, i being the current, Φ being the rotor flux, L being the inductances of the electrical machine, $L_{qs}$, and $b_{qs}$ being coefficients accounting for saturation effect, d and q being the axes in Park's reference frame, and $i_{qm}$ being a quadrature current value for which the magnetic flux is a linear function of the quadrature current.

7. A magnetic flux determination method as claimed in claim 6, wherein the adaptive Kalman filter is applied by carrying out steps of:
   i) modifying the dynamic magnetic flux model by integrating uncertainties in the model and a measurement noise;
   ii) discretizing the modified dynamic magnetic flux model; and
   iii) applying an adaptive Kalman filter algorithm to the modified and a discretized magnetic flux model.

8. A magnetic flux determination method as claimed in claim 2, wherein the adaptive Kalman filter is applied by carrying out steps of:
   i) modifying the dynamic magnetic flux model by integrating uncertainties in the model and a measurement noise;
   ii) discretizing the modified dynamic magnetic flux model; and
   iii) applying an adaptive Kalman filter algorithm to the modified and a discretized magnetic flux model.

9. A magnetic flux determination method as claimed in claim 3, wherein the adaptive Kalman filter is applied by carrying out steps of:
   i) modifying the dynamic magnetic flux model by integrating uncertainties in the model and a measurement noise;
   ii) discretizing the modified dynamic magnetic flux model; and
   iii) applying an adaptive Kalman filter algorithm to the modified and a discretized magnetic flux model.

10. A magnetic flux determination method as claimed in claim 1, wherein the dynamic magnetic flux model is written as:

$$\begin{cases} \varphi_d(t) = L_d i_d(t) + \sqrt{\dfrac{3}{2}}\,\Phi, \\ \varphi_q(t) = \begin{cases} L_{qs} i_q(t) - b_{qs}, & \text{if } i_q(t) \le -i_{qm}, \\ L_q i_q(t), & \text{if } -i_{qm} \le i_q(t) \le i_{qm}, \\ L_{qs} i_q(t) + b_{qs} & \text{if } i_{qm} \le -i_q(t) \end{cases} \end{cases}$$

with φ being the magnetic flux of the electrical machine, i being the current, Φ being the rotor flux, L being the inductances of the electrical machine, $L_{qs}$, and $b_{qs}$ being coefficients accounting for saturation effect, d and q being the axes in Park's reference frame, and $i_{qm}$ being a quadrature current value for which the magnetic flux is a linear function of the quadrature current.

11. A magnetic flux determination method as claimed in claim 10, wherein the adaptive Kalman filter is applied by carrying out steps of:
   i) modifying the dynamic magnetic flux model by integrating uncertainties in the model and a measurement noise;
   ii) discretizing the modified dynamic magnetic flux model; and
   iii) applying an adaptive Kalman filter algorithm to the modified and a discretized magnetic flux model.

12. A magnetic flux determination method as claimed in claim 1, wherein the adaptive Kalman filter is applied by carrying out steps of:
   i) modifying the dynamic magnetic flux model by integrating uncertainties in the model and a measurement noise;
   ii) discretizing the modified dynamic magnetic flux model; and
   iii) applying an adaptive Kalman filter algorithm to the modified and a discretized magnetic flux model.

13. A magnetic flux determination method as claimed in claim 12, wherein the adaptive Kalman filter algorithm is applied by carrying out steps of:
   (1) initializing k=0, state vector $\hat{x}(0)$ and a state of the covariance matrix $P(0|0)=P_0$;
   (2) applying a time update and measurement update equations to obtain $\hat{x}(k|k)$ and $P(k|k)$:

$$\begin{cases} \hat{x}(k|k-1) = A_d \hat{x}(k-1|k-1) + B_d u(k-1), \\ P(k|k-1) = A_d P(k-1|k-1) A_d^T + B_d Q_t B_d^T \end{cases}$$

$$\begin{cases} K(k) = P(k|k-1)(P(k|k-1)+R)^{-1} \\ \hat{x}(k|k) = \hat{x}(k|k-1) + K(k)(x(k) - \hat{x}(k|k-1)), \\ P(k|k) = (I - K(k))P(k|k-1) \end{cases}$$

(3) determining the magnetic flux φ estimated at time k by use of the formulas:

$$\begin{cases} \hat{\varphi}_d(k) = \hat{x}_1(k|k), \\ \hat{\varphi}_q(k) = \hat{x}_2(k|k) \end{cases}$$

with k being discretized time, A_d, B_d being state realization matrices, P being a covariance matrix of the state vector, R being a calibration matrix, K being the Kalman filter gain and Q_∈ being an adjustment parameter.

14. A magnetic flux determination method as claimed in claim 1, wherein the electrical machine is a salient-pole synchronous electrical machine.

15. A method for controlling an electrical machine, comprising steps of:
   a) determining a magnetic flux of the electrical machine by use of the method of determining the magnetic flux as claimed in claim 1; and
   b) controlling the electrical machine by use of the determined magnetic flux.

16. A control method as claimed in claim 15, wherein the electrical machine is controlled according to a method providing direct control of torque of the electrical machine implemented from the magnetic flux.

17. A system for controlling an electrical machine, comprising a control for implementing a control method as claimed in claim 16.

18. A system for controlling an electrical machine, comprising a control for implementing a control method as claimed in claim 15.

* * * * *